(12) United States Patent
Goergen et al.

(10) Patent No.: US 11,202,368 B2
(45) Date of Patent: Dec. 14, 2021

(54) PROVIDING ONE OR MORE CARBON LAYERS TO A COPPER CONDUCTIVE MATERIAL TO REDUCE POWER LOSS IN A POWER PLANE

(71) Applicant: Cisco Technology, Inc., San Jose, CA (US)

(72) Inventors: Joel Goergen, Soulsbyville, CA (US); Jessica Kiefer, San Jose, CA (US); Alpesh Umakant Bhobe, Sunnyvale, CA (US); Kameron Rose Hurst, Sonora, CA (US); D. Brice Achkir, Livermore, CA (US); Amendra Koul, San Francisco, CA (US); Scott Hinaga, Palo Alto, CA (US); David Nozadze, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/006,016

(22) Filed: Aug. 28, 2020

(65) Prior Publication Data

US 2021/0337666 A1 Oct. 28, 2021

Related U.S. Application Data

(60) Provisional application No. 63/016,523, filed on Apr. 28, 2020.

(51) Int. Cl.
*H05K 3/46* (2006.01)
*H05K 1/09* (2006.01)

(52) U.S. Cl.
CPC .......... *H05K 1/09* (2013.01); *H05K 3/4644* (2013.01); *H05K 2201/0323* (2013.01); *H05K 2201/0338* (2013.01); *H05K 2203/1545* (2013.01)

(58) Field of Classification Search
CPC .............. H05K 1/09; H05K 3/4644; H05K 2201/0323; H05K 2201/0338
USPC ....................................................... 174/255
See application file for complete search history.

(56) References Cited

U.S. PATENT DOCUMENTS

| 6,944,946 B2 | 9/2005 | Japp et al. |
| 7,334,325 B2 | 2/2008 | Roth et al. |
| 9,332,632 B2 | 5/2016 | Schneider et al. |
| 10,003,028 B2 | 6/2018 | Barth |
| 2019/0116657 A1* | 4/2019 | Fuller ............... B32B 15/20 |

FOREIGN PATENT DOCUMENTS

CN  207897217 U  9/2018

\* cited by examiner

*Primary Examiner* — Sherman Ng
(74) *Attorney, Agent, or Firm* — Edell, Shapiro & Finnan, LLC

(57) ABSTRACT

A power plane structure for a printed circuit board includes a copper layer, and a carbon layer applied directly to a surface of the copper layer. The carbon layer can include graphite or graphene. In additional embodiments, a duplicate power plane structure for a printed circuit board includes two power planes separated by an insulating core, each power plane including a copper layer and a carbon layer applied directly to a surface of the copper layer.

19 Claims, 8 Drawing Sheets

PROVIDING ONE OR MORE CARBON LAYERS TO A COPPER CONDUCTIVE MATERIAL TO REDUCE POWER LOSS IN A POWER PLANE

CROSS REFERENCE TO RELATED APPLICATION

This application claims priority under 35 U.S.C. § 119(e) to U.S. Provisional Patent Application Ser. No. 63/016,523, entitled "Using Brushed Graphite in a Duplicate Power Plane to Reduce Power Loss", filed Apr. 28, 2020, the disclosure of which is incorporated herein by reference in its entirety for all purposes.

TECHNICAL FIELD

The present disclosure relates to a power plane for a printed circuit board used in electronic devices.

BACKGROUND

Current density in a power plane is beyond maximum in present core routing and switching products. This can be seen in total power loss across a power plane or set of power planes reaching 8% with the operational temperature of the printed circuit board (PCB) under 130° C. for ASIC designs or other power consuming designs targeting over 700 watts (e.g., soon extending to over 1500 watts). To maintain power level efficiency goals in a time when sustainability and green energy are the focus, other methods to increase conductivity of the power plane are desired.

DESCRIPTION OF EXAMPLE EMBODIMENTS

Overview

In an embodiment, a power plane structure for a printed circuit board (PCB) comprises a copper layer, and a carbon layer applied directly to a surface of the copper layer. The carbon layer can comprise graphite and/or graphene.

In another embodiment, a PCB for an electronic device comprises a first duplicate power plane structure and a second duplicate power plane structure, each of the first and second duplicate power plane structures comprising the following: a first copper layer and a first carbon layer applied directly to a surface of the first copper layer, a second copper layer and a second carbon layer applied directly to a surface of the second copper layer, and an insulating core disposed between the first and second copper layers, where the first and second carbon layers face toward and directly contact the insulating core. The PCB further comprises an insulating core disposed between the first and second power plane structures.

In a further embodiment, a method of forming a printed circuit board (PCB) comprises applying a carbon material to a surface of a copper foil layer to form a conductive layer structure, applying the conductive layer structure to a surface of a dielectric material layer to form a multilayered structure, applying heat treatment and/or pressure treatment to the multilayered structure to form a power plane structure, and integrating the power plane structure with one or more further layers to form the PCB.

Example Embodiments

The present disclosure relates to a power plane that comprises a layer or sheet formed of a copper and carbon layer (e.g., a graphite layer or a graphene layer) on one or more surfaces of the copper layer or sheet. The power plane formed as described herein has increased conductivity in relation to a power plane not including the carbon layer(s). The carbon layers can be formed on the surfaces of the copper layers or sheets (e.g., via a brushing process or based upon other techniques as described herein) and/or incorporated within or between copper layers. The power plane as described herein can be utilized in a printed circuit board (PCB) for providing electrical power to the PCB in any type of electronic device (e.g., electronic communication/networking devices, such as switches, routers, networking devices, etc. and/or any other type of electronic and/or computing devices).

Figure 1A:
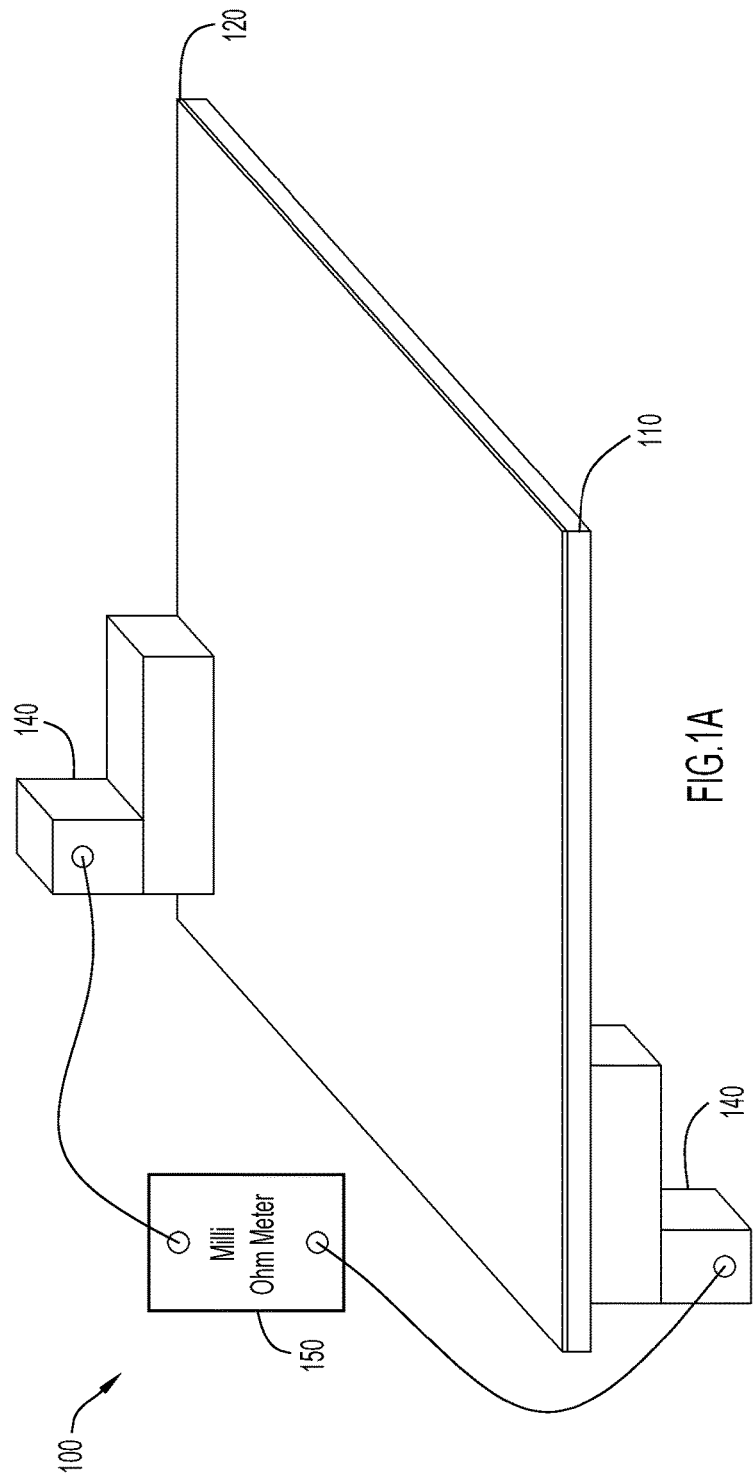
FIG. 1A depicts a view in perspective of an embodiment of a layer or sheet of copper with graphite lightly applied to a surface of the copper sheet.
Figure 1B:
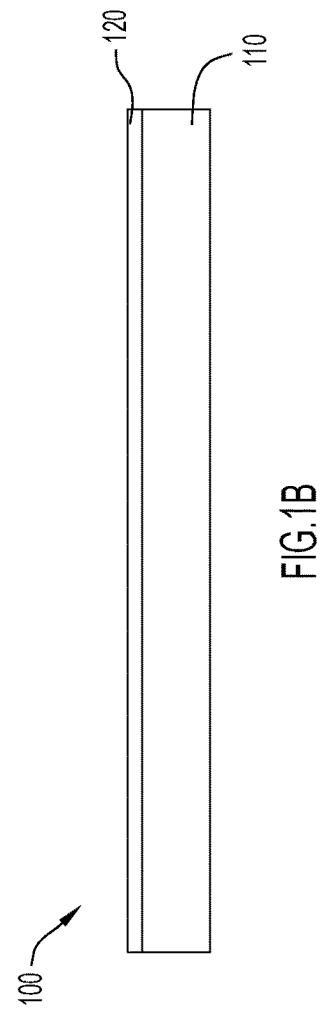
FIG. 1B depicts a side view in cross-section of the embodiment of FIG. 1A.

The power planes as described herein provide high power areas to a PCB without the requirement, e.g., of a power off load board or other devices. In particular, increased conductivity of a copper sheet is enhanced by the addition of a thinly applied layer of carbon, such as graphite or graphene, to a surface of the copper sheet. For example, as depicted in FIGS. 1A and 1B, a power plane structure 100 comprises a copper foil sheet 110 having a thickness ranging from about 0.35 mil to about 5.0 mils (e.g., no greater than about 2 mils) thickness, or about 0.25 oz/ft$^2$ to about 4 oz/ft$^2$ (e.g., no greater than about 1.75 oz/ft$^2$), with a graphite layer 120 applied to a surface of the copper layer. The graphite layer 120 can have a thickness that is much less than the thickness of the copper foil sheet (e.g., a thickness that is less than 0.35 mil) and is applied directly on and substantially or entirely covers the surface of the copper foil sheet 110. When utilizing graphene, the thickness of a graphene layer is also less than that of the copper foil layer (e.g., from about 2.5 Angstroms to about 5.0 Ångstroms, depending upon whether the graphene layer is a monolayer or bilayer). The overall resistance of the structure 100 can be measured, e.g., by securing copper bar clamps 140 to opposing ends of the structure and measuring resistance with an ohm meter 150. When comparing the structure 100 to a copper foil sheet without any graphite layer, measured resistance is lower for the structure 100, which also enables greater conductivity and reduced power loss for the power plane structure during operation.

Figure 2A:
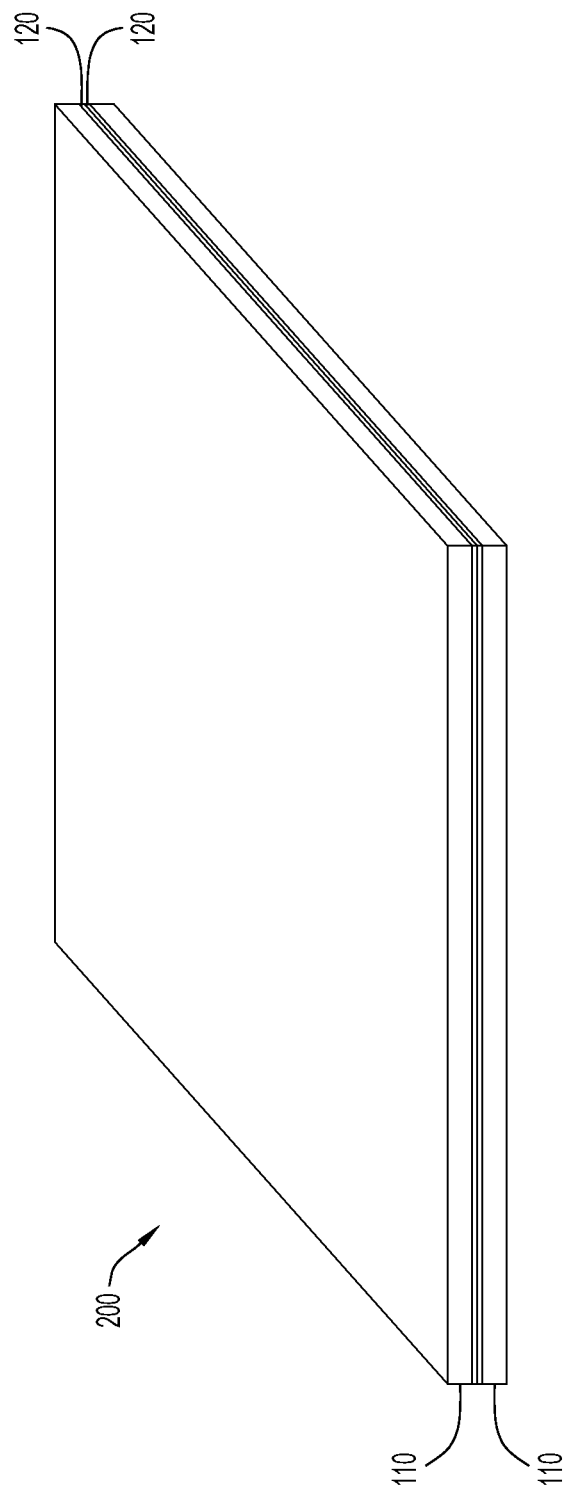
FIG. 2A depicts a view in perspective of an embodiment of two copper sheets combined together, each with graphite lightly applied to a surface of the copper sheet.
Figure 2B:
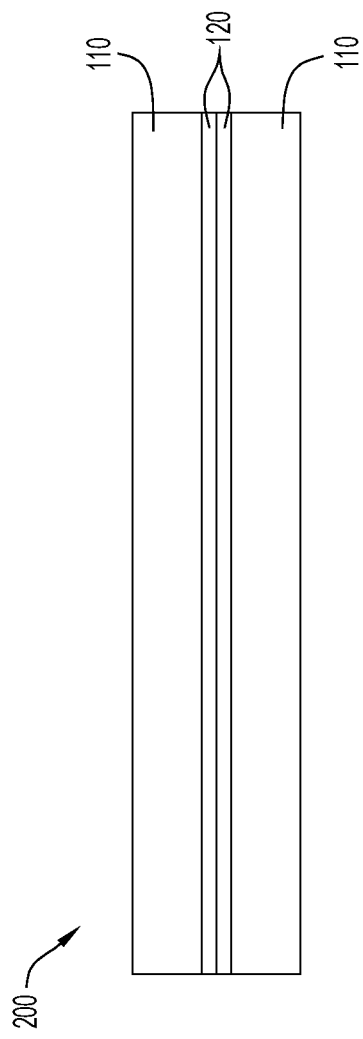
FIG. 2B depicts a side view in cross-section of the embodiment of FIG. 2A.

Similarly, two power plane structures 100 can be combined together in a manner as depicted in FIGS. 2A and 2B so as to form a structure 200, where the graphite layers 120 covering the surfaces of the copper foil sheets 110 face toward and are adjacent each other. This structure 200 also provides a power plane configuration having enhanced conductivity and a measured resistance that is lower in comparison to one or a pair of copper sheets combined with each other.

Figure 3A:
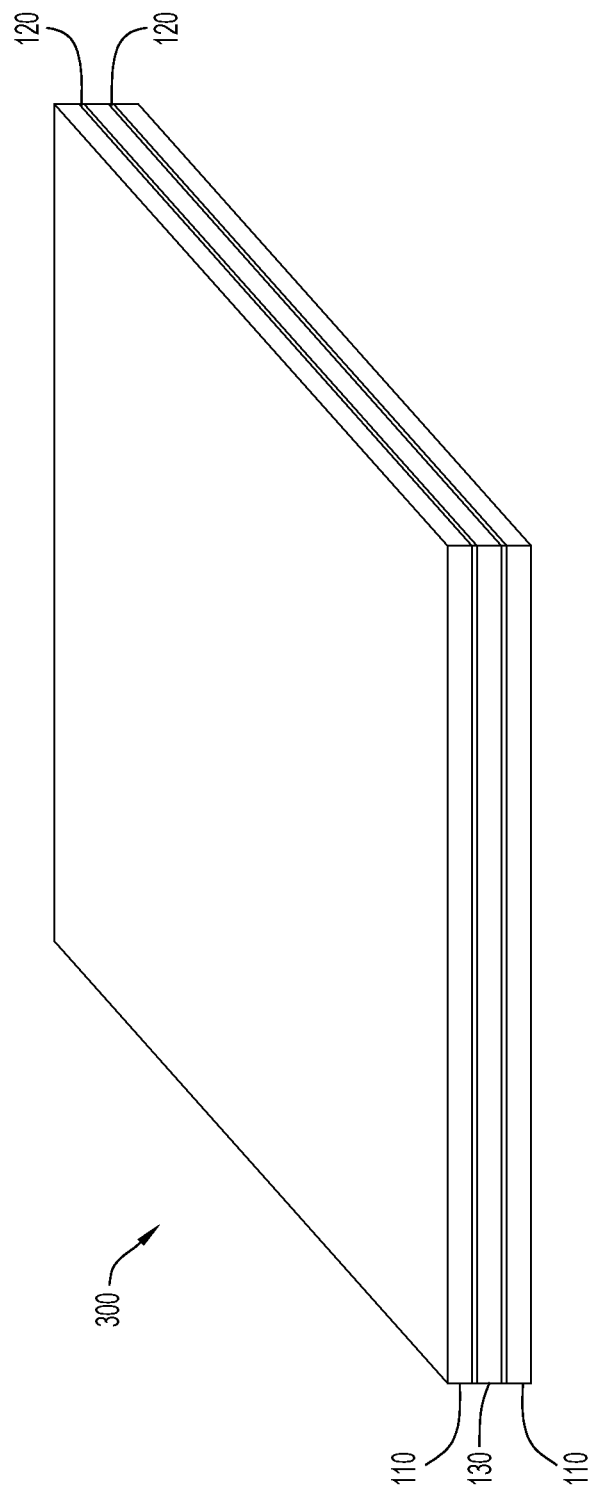
FIG. 3A depicts a view in perspective of an example embodiment of a duplicate power plane structure comprising a pair of copper sheets with graphite applied to a surface of each copper sheet and a dielectric layer disposed between the copper sheets.
Figure 3B:
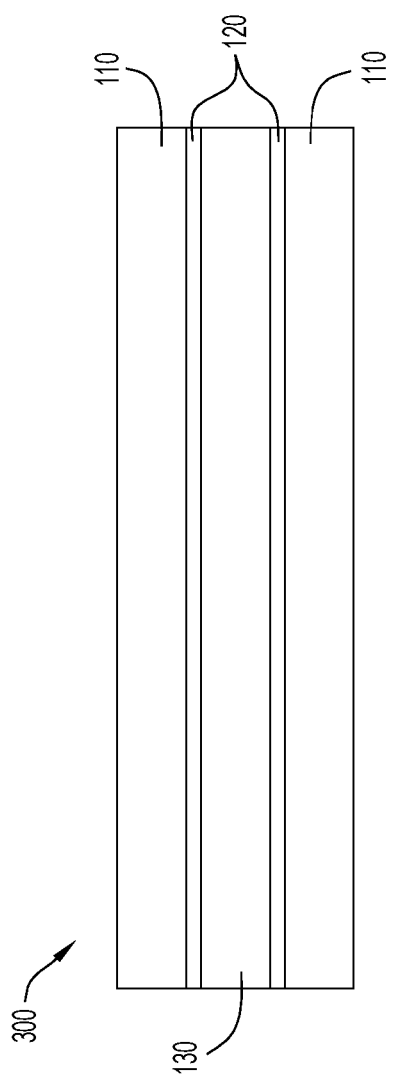
FIG. 3B depicts a side view in cross-section of the embodiment of FIG. 3A.

A duplicate power plane structure 300 is depicted in FIGS. 3A and 3B and includes a pair of power plane structures 100 combined together and with a core layer 130 disposed or sandwiched between the structures 100. The core layer 130 can comprise an insulating/dielectric sheet glass material formed from a 106 prepeg material or any other type of prepeg material. Each power plane structure 100 is oriented such that the graphite layer 120 faces toward and is adjacent a surface of the core layer 130. The core layer 130 disposed between power plane structures 100 can have a dielectric thickness in the range of about 1.2 mils to about 3.5 mils (e.g., less than about 1.5 mils, such as about 1.2 mils). The duplicate power plane structure 300 provides enhanced conductivity and reduced resistivity in relation to a single copper sheet layer having the same or similar thickness as the copper sheets forming the duplicate power plane structure 300.

Figure 4A:
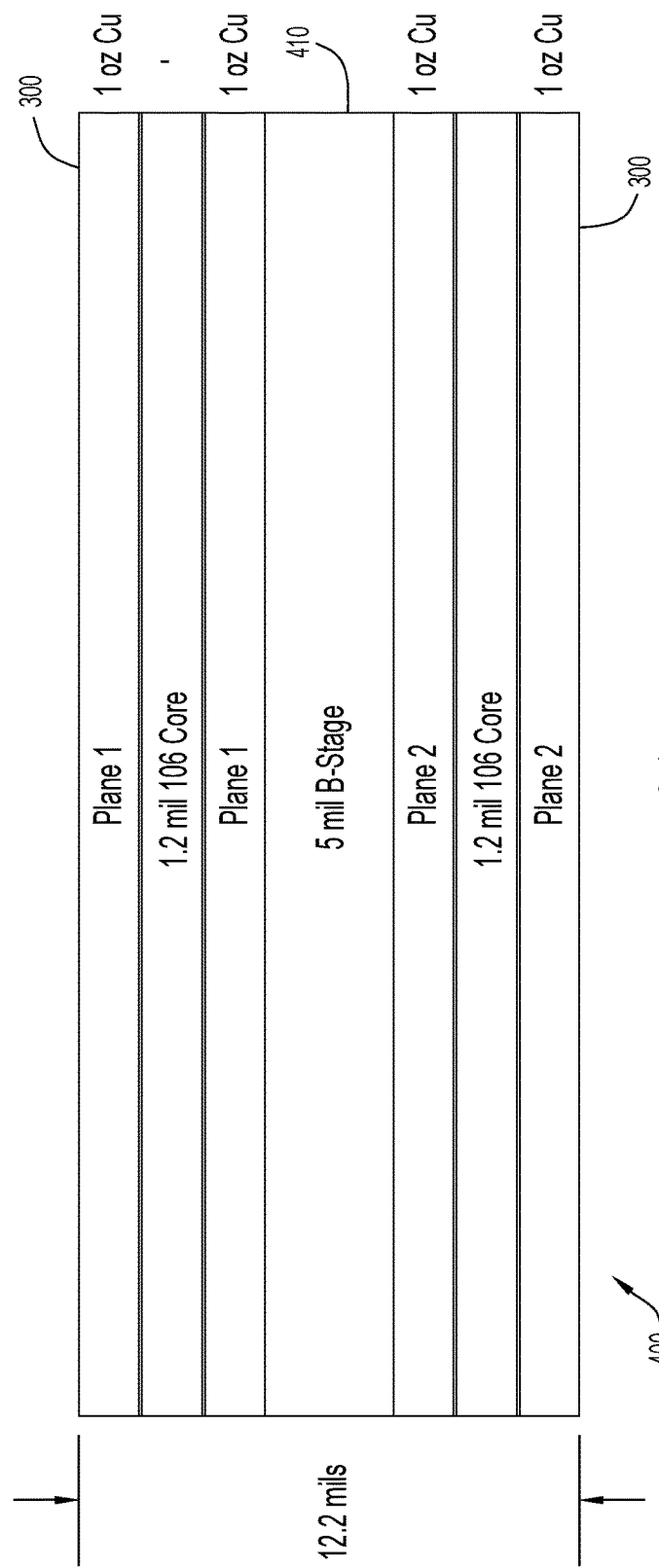
FIG. 4A depicts a partial side view in cross-section of an example embodiment of a printed circuit board (PCB) with a duplicate power plane having a configuration as set forth in FIG. 3A disposed on each side of a core.
Figure 4B:
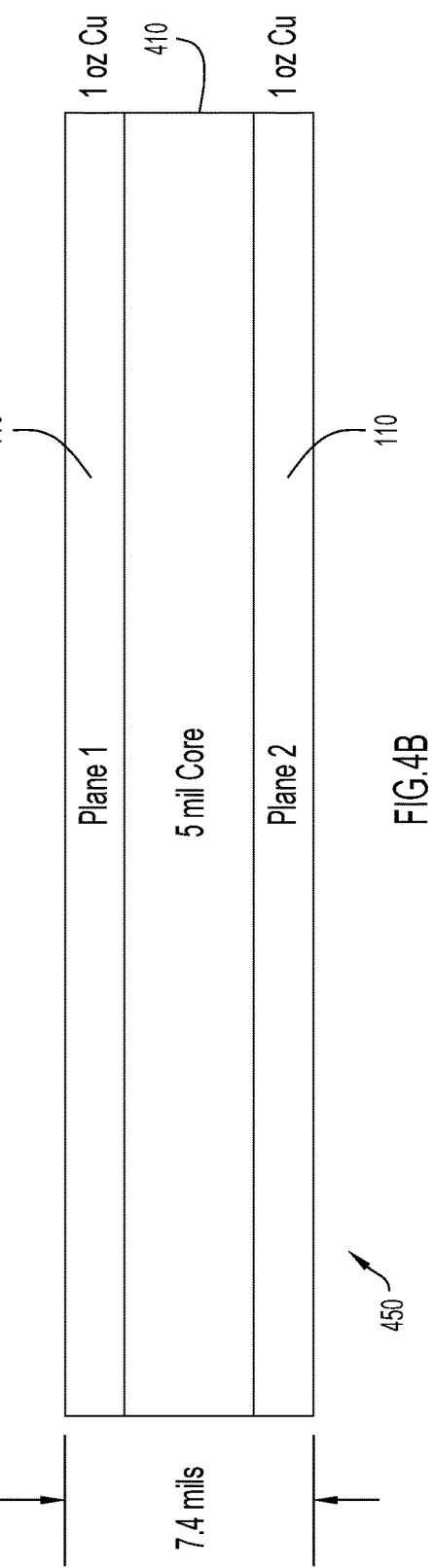
FIG. 4B depicts a partial side view in cross-section of a PCB with a duplicate power plane provided using a single copper sheet for each power plane.

A pair of duplicate power plane structures 300 can be combined in a manner to form a layered structure 400 as depicted in FIG. 4A. In particular, a layered PCB structure 400 for a printed circuit board (PCB) is formed, in which a glass resin (e.g., B-stage) core layer 410 is disposed or sandwiched between two duplicate power plane structures 300. In the embodiment of FIG. 4A, each copper foil sheet 110 having a graphite layer 120 and forming a power plane structure 100 (identified as plane 1 or plane 2) of the duplicate power plane structure 300 can have a thickness of about 1.2 mil (about 1 oz/ft$^2$). The core layer 130 disposed between pairs of power plane structures 100 can comprise a 106 prepeg core having a thickness of about 1.2 mil. The core layer 410 disposed between each duplicate power plane structure 300 can comprise a B-stage material having a thickness of about 5 mil. In comparison, referring to FIG. 4B, another PCB structure 450 is formed including a pair of 1.2 mil (1 oz/ft$^2$) thick copper foil sheets 110 (not including a graphite layer) and a 5 mil thick core layer 410 that is the same or similar as the core layer 410 of the PCB structure 400.

Thus, the PCB structure 450 (FIG. 4B) is defined by a 1 oz over 1 oz-5 mil two sheet core with a "plane 1" consisting of a copper sheet separated and electrically isolated from a "plane 2" consisting of a copper sheet. In contrast, the PCB structure 400 (FIG. 4A) is defined by a 1 oz over 1 oz 1.2 mil single sheet core with an identical and stacked "plane 1" pair that includes copper and graphite, a second 1 oz over 1 oz 1.2 mil single sheet core with an identical and stacked "plane 2" pair that includes copper and graphite, and a 5 mil two sheet core that electrically isolates the "plane 1" from the "plane 2". The layered PCB structure 400 has a thickness (about 12.2 mils) that is slightly greater in relation to the thickness (about 7.4 mils) of the layered PCB structure 450. However, due to the increase in copper (e.g., a 2× or twofold increase) as well as the multiple graphite layers 120 (four total layers) applied to the copper foil sheets 110 for the layered PCB structure 400, the structure 400 provides an effective gain in overall conductivity in relation to the structure 450. This can be most effective for certain PCB applications that demand high power consumption, where the duplicate power plane structure only slightly increases thickness while improving conductivity (due to, at least in part, the incorporation of graphite or graphene within the power plane structure) in relation to conventional power planes. For example, incorporating graphite into the power plane structure as described herein can increase power plane conductivity by as much as 10% or greater, while incorporating graphene into the power plane structure as described herein can increase power plane conductivity by as much as 60% or greater. Power loss in the PCB can also be reduced with implementation of power plane structures as described herein in relation to conventional power planes.

A carbon material (graphite or graphene) can be applied to a copper surface in any suitable manner that achieves formation of the carbon layer at a suitable or desired thickness. In example embodiments, graphite can be applied to a surface of a copper foil sheet via a suitable brushing process (e.g., via an airbrush), where the graphite can be applied in a paint or liquid (e.g., dye) form that is then dried to facilitate adhering and forming of a layer of the graphite at the copper surface. A graphite or graphene layer can be also applied to a copper foil sheet by other techniques such as chemical vapor deposition (CVD), or sintering of graphite or graphene powder on a copper foil sheet. In another embodiment, a graphite or graphene layer can be initially formed, followed by application of copper via electrodeposition to the graphite or graphene layer to form a structure 100 as depicted in FIG. 1A.

Figure 5:
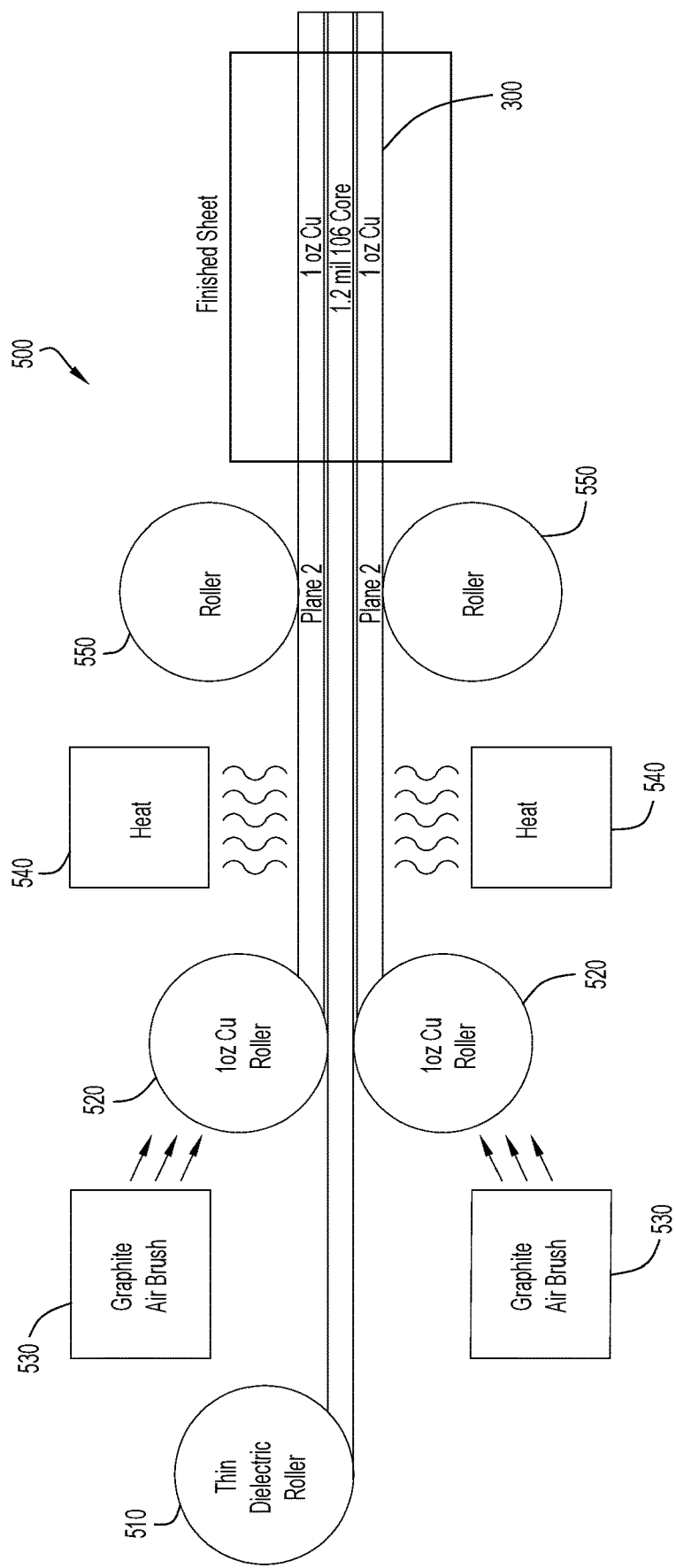
FIG. 5 depicts an example continuous process apparatus that forms the duplicate power plane of FIG. 3A.
Figure 6:
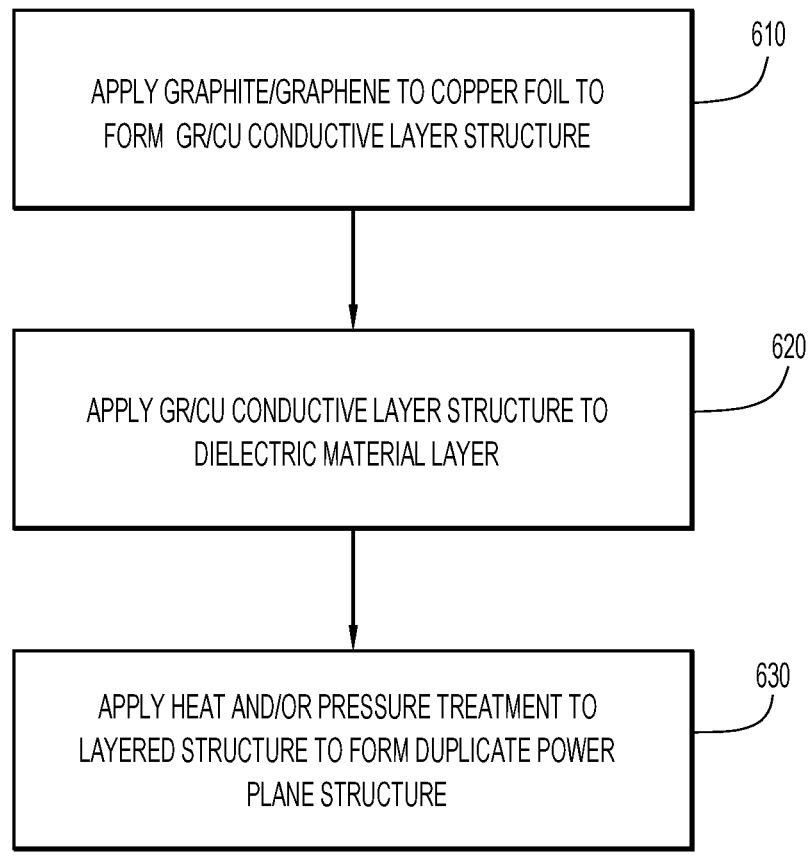
FIG. 6 is a flowchart describing process steps associated with the process of FIG. 5.

Referring to FIG. 5, an example continuous process apparatus 500 is depicted that forms a duplicate power plane structure 300 as depicted, e.g., in FIG. 3A. The flowchart of FIG. 6 also provides process steps corresponding with the process apparatus 500 of FIG. 5. It is noted that, during the formation of layers (in particular the formation of a carbon layer adjacent a copper layer) in this process as well as other processes (e.g., a CVD process) as described herein, the layer formation and/or other operations of the process are preferably conducted in a low pressure or vacuum environment.

In the apparatus 500, a supply of a thin dielectric material (e.g., prepeg core material having a thickness of about 1.2 mil) is fed from a roller 510, where the thin dielectric material layer forms the core layer 130 of the duplicate power plane structure 300. Downstream from the dielectric material roller 510 in the apparatus 500 is a pair of copper rollers 520. Each copper roller includes a thin sheet of copper foil (e.g., having a thickness of about 1 oz/ft$^2$ or 1.2 mil). A graphite airbrush 530 is located in close proximity with a corresponding copper roller 520. The graphite airbrush 530 applies a layer of a carbon material, in particular graphite in dry form, to a surface of the copper foil sheet (step 610) so as to substantially or entirely coat the copper foil sheet surface immediately prior to the copper foil sheet being released from the roller 520, thus forming a conductive layer structure. Each graphite coated copper foil sheet/conductive layer structure is released from its roller 520 onto a surface of the thin dielectric material layer to form a multilayered structure (step 620). In particular, the dielectric material layer is passed through the pair of rollers 520 such that each copper foil sheet coated with a graphite coating that faces the dielectric material layer is applied to an opposing side of the dielectric material layer (see FIG. 6, immediately downstream from the rollers 520). Located downstream from the copper rollers 520 are two heaters 540 disposed on either side of the layered structure (dielectric material layer disposed between graphite coated copper layers). The heaters 540 apply heat treatment (e.g., via convective, radiant and/or any other suitable heat treatment) to the layered structure (step 630) to dry the brushed graphite material thus forming a hardened, solidified and continuous graphite layer at each copper surface. In an example embodiment, heat treatment can be applied to the layered structure within a temperature range of about 900° C. to about 1100° C. for a period of from about 10 minutes to about 60 minutes. A pair of rollers 550 are provided at a location downstream from the heaters 540 and on either side of the layered structure. The rollers 550 compress or provide suitable pressure along each side of the multilayered structure as it passes through the rollers (step 630). The resultant layered structure forms a power plane structure, in particular a duplicate power plane structure 300, which can be integrated as part of a multilayered structure for a PCB. While the apparatus of FIG. 5 depicts the formation of a duplicate power plane structure 300 (FIG. 3A), a power plane structure such as depicted in FIG. 1A (with the addition of a dielectric core layer) can also be formed with a slight modification to the apparatus of FIG. 5.

The above described process of FIG. 5 can be modified in any suitable manner to form a duplicate power plane structure as depicted, e.g., in FIG. 3A. In an alternative embodiment, the process can be a non-continuous or batch type process in which the copper layers can comprise copper sheets in the form of a rigid copper material (e.g., a copper-clad laminate material or a rigid copper foil) having a specified rectangular or other shaped dimension, where the copper layers are placed within a chemical vapor deposition (CVD) chamber and graphite or graphene is vapor deposited (i.e., built up into a monolayer, a bilayer or any suitable number of layers) to form the carbon layer on a surface of the surface of the copper layer. Within the CVD chamber, a vacuum is maintained under a low pressure gaseous atmosphere (e.g., providing a combination of hydrogen and argon within the chamber). Low pressure methane is introduced to provide the source of carbon, where the methane is converted to graphene when contacting the hot surface of the copper layer. The graphene coated copper layer can be removed from the CVD chamber. A thin dielectric material having suitable dimensions can be placed between two coated copper layers (where the carbon/graphene layer for each copper layer faces the dielectric material), and the layered structure can then be heated (e.g., in a similar manner and under similar conditions as previously described for the heat treatment step as depicted in FIG. 5). Depending upon the size of the copper and dielectric sheets used to form the layered structure, the final structure can be separated into segments that are used to form power plane structures for a PCB.

Figure 7A:
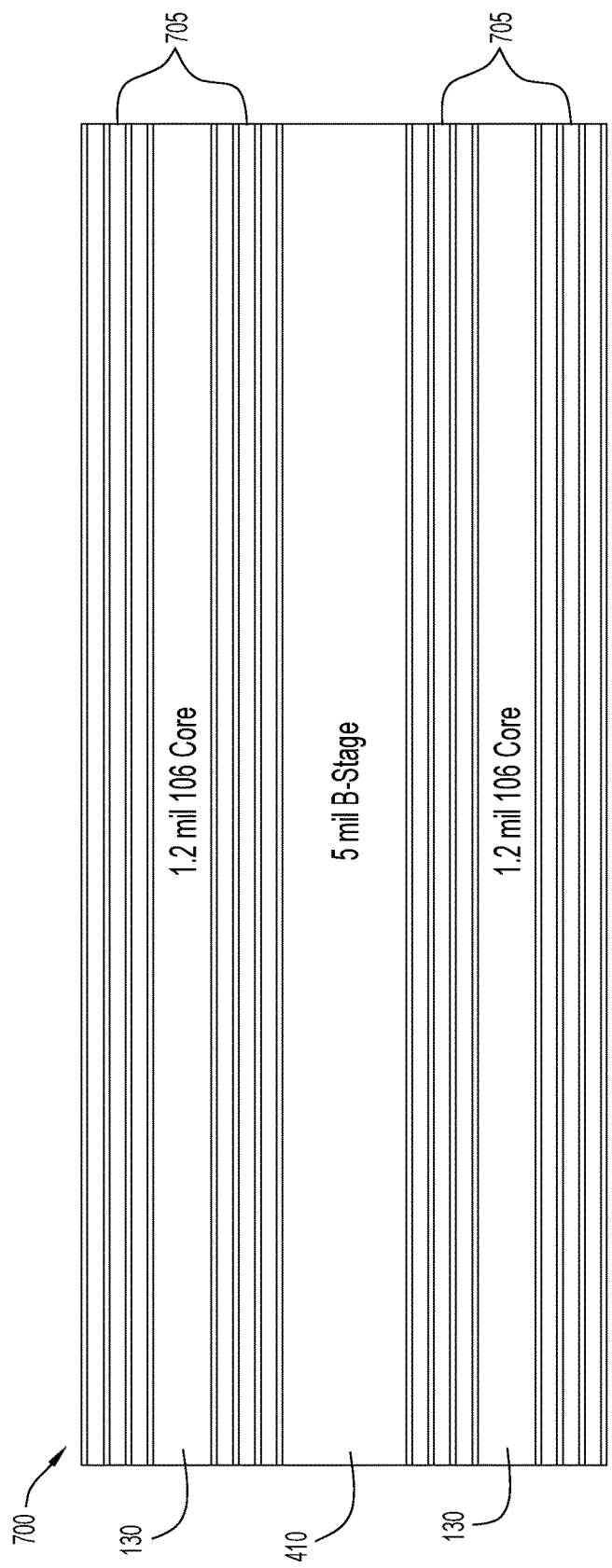
FIGS. 7A and 7B depict a partial side view in cross-section of an example embodiment of a PCB with a duplicate power plane (FIG. 7A) and a power plane structure of the PCB (FIG. 7B) having a configuration that is slightly modified in relation to the structure depicted in FIG. 3A.
Figure 7B:
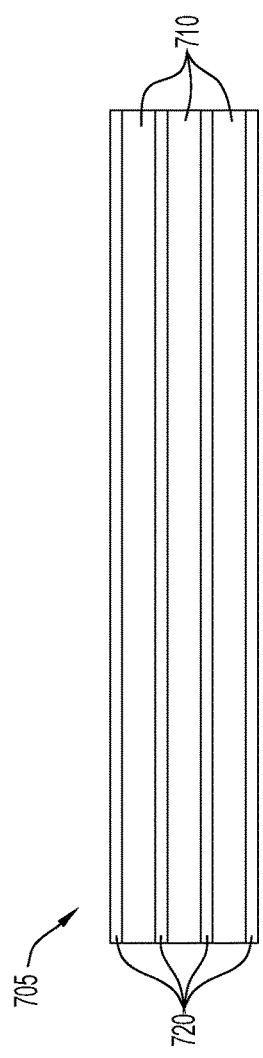

Referring to FIGS. 7A and 7B, an alternative embodiment for a duplicate power plane structure is depicted in which multiple carbon layers of graphite and/or graphene are integrated within and at one or more outer surfaces of a copper layer. The PCB structure 700 has a configuration similar to the PCB structure of FIG. 4A, where each duplicate power plane structure includes a core layer 130 (e.g., a prepeg material having a thickness of about 1.2 mils) disposed or sandwiched between two power plane structures 705, and a glass resin (e.g., 5 mil B-stage) core layer 410 disposed or sandwiched between the two power plane structures 705. However, the power plane structures 705 (FIG. 7B) differ from the power plane structures 300 (FIG. 4A) in that each structure 705 comprises a plurality of carbon layers integrated with a copper sheet. The power plane structure 705 comprises a plurality of carbon layers 720 (e.g., graphite or graphene layers) provided within and at the surface regions of a copper layer. In an example embodiment, the power plane structure 705 can be formed by building up an alternating series of stacked layers comprising a carbon layer 720, followed by a copper sub-layer 710, followed by a carbon layer 720, followed by a copper sub-layer 710, etc., where the copper sub-layers 710 can comprise copper foil sheets or electrodeposited copper (electrodeposited to a suitable thickness) that, when combined with the carbon layers 720, define a copper material layer. Each carbon layer 720 can be formed over a corresponding copper sub-layer 710 in any suitable manner (e.g., via air brushing graphite on the copper surface, or deposition of graphite or graphene via CVD). Any suitable process can also be utilized to apply graphene to a copper layer to atomically attach graphene within the copper layer and/or to a surface of the copper layer. Utilizing chemical vapor deposition (CVD) techniques (such as those previously described herein), a series of carbon and copper layers can be built up (with, e.g., graphene layers disposed within copper layers) within a CVD chamber at temperatures ranging from about 900° C. to about 1100° C. for a time period within a range from about 10 minutes to about 60 minutes.

Figure 8:
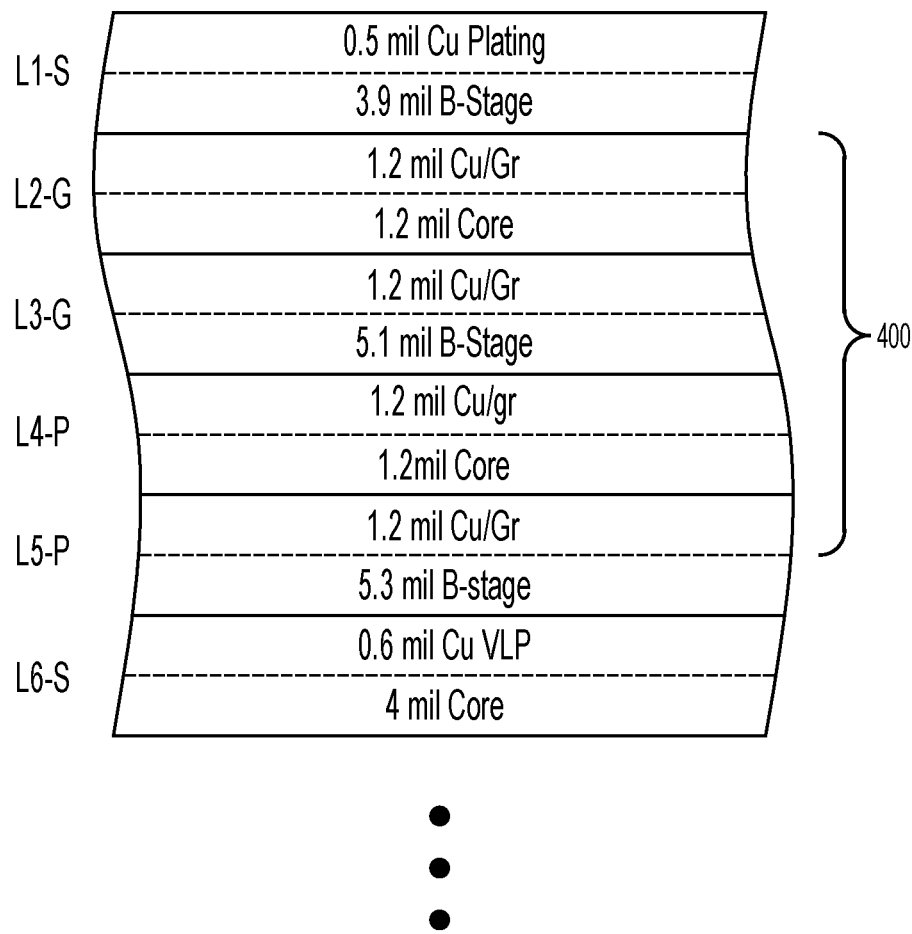
FIG. 8 depicts a partial side view in cross-section of an example embodiment of a CPU card implementing the PCB structure with duplicate power plane of FIG. 4A.

The duplicate power plane structure can be integrated within a layered PCB structure for any type of electronic device, such as router devices, switching devices, networking devices, etc., and particularly in devices requiring high power consumption during operation. Referring to FIG. 8, an example multilayered PCB is depicted (in a side cross-sectional view) showing Ground (G) layers, Signal (S) layers, and Power (P) layers in a stacked alignment with each other. For ease of reference, only six layers L1-L6 are shown, but it is understood that the PCB can include several more G, S and P layers as desired for a particular application. For example, a 20+ layered PCB can be formed including one or more power plane structures as described herein, where the PCB can be designed and implemented as a CPU card for a networking device (e.g., a networking device that supports and provides data routing for high-scale WAN and/or other network aggregations). The PCB structure includes Layer L1 (Signal layer) comprising 0.5 mil copper plating and a 3.9 mil B-stage resin layer. Layers L2-L5 are formed by the PCB structure 400 including duplicate power plane structures as shown in FIG. 4A (where Layers L2 and L3 are Ground-G layers, and Layers 4 and 5 are Power-P layers), in which the Cu/Gr layers comprise copper foil sheets with graphite (or graphene) adhered to the surface of the copper foil sheets with 1.2 mil cores and 5 mil B-stage layer arranged in the manner as previously described for the structure 400. Thus, the PCB structure 400 is integrated with other layers within the PCB. Layer L6 (which is isolated from Layer L5 via a 5.3 mil B-stage layer) comprises a signal layer (S) that includes a 0.6 mil very low profile (VLP) copper foil and a 4 mil core (which isolates Layer L6 from the next layer beneath L6). While not shown, the PCB structure can continue, with further S, G and optionally P layers for any number of successive layers (i.e., Layers L7, L8, L9, . . . LN) as desired and depending upon a particular configuration for the CPU card and components associated with the PCB. The P layers (e.g., Layers L4 and L5) can be electrically connected (e.g., through vias) with any signal (S) layers (e.g., Layer L6) so as to provide electrical power to components connected or associated with the PCB via its signal (S) layers.

Accordingly, the power plane configurations (e.g., duplicate power planes) as described herein can be integrated within layers of a PCB to effectively reduce power loss and provide increased conductivity in relation to conventional power plane configurations.

In example embodiments, a power plane structure for a printed circuit board (PCB) can comprise a copper layer, and a carbon layer applied directly to a surface of the copper layer. The carbon layer of the power plane structure can comprise graphite or graphene. The power plane structure can further comprise a second carbon layer disposed within the copper layer. A printed circuit board (PCB) for an electronic device can include the power plane structure.

The power plane structure can further comprise a duplicate power plane structure, where the duplicate power plane structure can comprise a first copper layer and a first carbon layer applied directly to a surface of the first copper layer, a second copper layer and a second carbon layer applied directly to a surface of the second copper layer, and an insulating core disposed between the first and second copper layers. The insulating core can have a thickness ranging from 1.2 mils to 3.5 mils. In the power plane structure, the first carbon layer and the second carbon layer can face toward and directly contact the insulating core.

The power plane structure can further comprise a second duplicate power plane structure, and the second duplicate power plane structure can comprise a third copper layer and a third carbon layer applied directly to a surface of the third copper layer, a fourth copper layer and a fourth carbon layer applied directly to a surface of the fourth copper layer, and a second insulating core disposed between the third and fourth copper layers. A third insulating core can be disposed between the duplicate power plane structure and the second duplicate power plane structure.

The copper layer of the power plane structure can have a thickness ranging from 0.35 mil to 5.0 mil. The carbon layer can have a thickness ranging from 2.5 Ångstroms to 5.0 Ångstroms.

In another example embodiment, a printed circuit board (PCB) for an electronic device can comprise a first duplicate power plane structure and a second duplicate power plane structure, where each of the first and second duplicate power plane structures can comprise a first copper layer and a first carbon layer applied directly to a surface of the first copper layer, a second copper layer and a second carbon layer applied directly to a surface of the second copper layer, and an insulating core disposed between the first and second copper layers, where the first and second carbon layers face toward and directly contact the insulating core. An insulating core can be disposed between the first and second duplicate power plane structures.

The PCB can comprise a signal trace defined in a conductive layer within the PCB, where the first duplicate power plane structure or the second duplicate power plane structure connects with the signal trace to provide power to an electrical component of the PCB. Each of the first and second carbon layers of the first and second duplicate power plane structures can comprise graphite or graphene.

In another embodiment, a method of forming a printed circuit board (PCB) can comprise applying a carbon material to a surface of a copper foil layer to form a conductive layer structure, applying the conductive layer structure to a surface of a dielectric material layer to form a multilayered structure, applying heat treatment to the multilayered structure to form a power plane structure, and integrating the power plane structure with one or more further layers to form the PCB.

In the method, the applying the carbon material to the surface of the copper foil layer further can comprise applying the carbon material to a first surface of a first copper foil layer to form a first conductive layer structure, and applying the carbon material to a second surface of a second copper foil layer to form a second conductive layer structure. The applying the conductive layer structure to the surface of the dielectric material layer can further comprise applying the first conductive layer structure to a first surface of the dielectric material layer and applying the second conductive layer structure to a second surface of the dielectric material layer to form the multilayered structure.

In the method, the first conductive layer structure can be applied to the first surface of the dielectric material layer such that the carbon material of the first conductive layer structure faces toward and directly contacts the first surface of the dielectric material layer, and the second conductive layer structure can be applied to the second surface of the dielectric material layer such that the carbon material of the second conductive layer structure faces toward and directly contacts the second surface of the dielectric material layer.

In the method, the carbon material can comprise graphite, and the applying the carbon material to the surface of the copper foil layer can further comprise brushing the graphite over the surface of the copper foil layer.

In the method, the copper foil layer can have a thickness ranging from 0.35 mil to 5.0 mil. In addition, the carbon material can be applied to the copper foil layer to form the conductive layer structure in which the carbon material forms a carbon layer having a thickness ranging from 2.5 Ångstroms to 5.0 Ångstroms.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A duplicate power plane structure for a printed circuit board (PCB), the duplicate power plane structure comprising:
    a first copper layer and a first carbon layer applied directly to a surface of the first copper layer;
    a second copper layer and a second carbon layer applied directly to a surface of the second copper layer; and
    an insulating core disposed between the first and second copper layers;
    wherein each of the first carbon layer and the second carbon layer faces toward and directly contacts the insulating core.

2. The duplicate power plane structure of claim 1, wherein the first carbon layer comprises graphite or graphene.

3. The duplicate power plane structure of claim 1, wherein the first carbon layer includes a portion disposed within the first copper layer.

4. The duplicate power plane structure of claim 3, wherein the second carbon layer includes a portion disposed within the second copper layer.

5. The duplicate power plane structure of claim 1, wherein the insulating core has a thickness ranging from 1.2 mils to 3.5 mils.

6. The duplicate power plane structure of claim 2, wherein the second carbon layer comprises graphite or graphene.

7. The duplicate power plane structure of claim 1, further comprising a second duplicate power plane structure, the second duplicate power plane structure comprising:
a third copper layer and a third carbon layer applied directly to a surface of the third copper layer;
a fourth copper layer and a fourth carbon layer applied directly to a surface of the fourth copper layer; and
a second insulating core disposed between the third and fourth copper layers.

8. The duplicate power plane structure of claim 7, further comprising a third insulating core disposed between the duplicate power plane structure and the second duplicate power plane structure.

9. The duplicate power plane structure of claim 1, wherein each of the first copper layer and the second copper layer has a thickness ranging from 0.35 mil to 5.0 mil.

10. The duplicate power plane structure of claim 9, wherein each of the first carbon layer and the second carbon layer has a thickness ranging from 2.5 Ångstroms to 5.0 Ångstroms.

11. A printed circuit board (PCB) for an electronic device, the PCB comprising the power plane structure of claim 1.

12. The duplicate power plane structure of claim 1, wherein each of the first carbon layer and the second carbon layer has a thickness ranging from 2.5 Ångstroms to 5.0 Ångstroms.

13. A printed circuit board (PCB) for an electronic device, the PCB comprising:
a first duplicate power plane structure and a second duplicate power plane structure, each of the first and second duplicate power plane structures comprising:
a first copper layer and a first carbon layer applied directly to a surface of the first copper layer;
a second copper layer and a second carbon layer applied directly to a surface of the second copper layer; and
an insulating core disposed between the first and second copper layers, wherein the first and second carbon layers face toward and directly contact the insulating core; and
a further insulating core disposed between the first and second duplicate power plane structures.

14. The PCB of claim 13, further comprising a signal trace defined in a conductive layer within the PCB, wherein the first duplicate power plane structure or the second duplicate power plane structure connects with the signal trace to provide power to an electrical component of the PCB.

15. The PCB of claim 13, wherein each of the first and second carbon layers of the first and second duplicate power plane structures comprises graphite or graphene.

16. The PCB of claim 13, wherein the insulating core for each of the first duplicate power plane structure and the second duplicate power plane structure has a thickness ranging from 1.2 mils to 3.5 mils.

17. The PCB of claim 13, wherein each of the first copper layer and the second copper layer for each of the first duplicate power plane structure and the second duplicate power plane structure has a thickness ranging from 0.35 mil to 5.0 mil.

18. The PCB of claim 17, wherein each of the first carbon layer and the second carbon layer for each of the first duplicate power plane structure and the second duplicate power plane structure has a thickness ranging from 2.5 Ångstroms to 5.0 Ångstroms.

19. The PCB of claim 13, wherein each of the first carbon layer and the second carbon layer for each of the first duplicate power plane structure and the second duplicate power plane structure has a thickness ranging from 2.5 Ångstroms to 5.0 Ångstroms.

* * * * *